(12) United States Patent
Kim (10) Patent No.: US 8,735,921 B2
(45) Date of Patent: May 27, 2014

(54) LIGHT EMITTING DEVICE, LIGHT EMITTING DEVICE PACKAGE, AND LIGHTING SYSTEM

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 283 days.

(21) Appl. No.: 12/959,102

(22) Filed: Dec. 2, 2010

(65) Prior Publication Data

US 2011/0220940 A1 Sep. 15, 2011

(30) Foreign Application Priority Data

Mar. 9, 2010 (KR) ........................ 10-2010-0020922

(51) Int. Cl.
*H01L 21/00* (2006.01)

(52) U.S. Cl.
USPC ................................. 257/98; 257/99; 257/91

(58) Field of Classification Search
USPC ............................................... 257/91, 98–99
See application file for complete search history.

(56) References Cited

U.S. PATENT DOCUMENTS

| | | | | |
|---|---|---|---|---|
| 7,733,011 | B2* | 6/2010 | Cina et al. ................... | 313/504 |
| 8,120,054 | B2* | 2/2012 | Seo et al. ..................... | 257/99 |
| 8,513,679 | B2* | 8/2013 | Jeong et al. .................. | 257/79 |
| 2004/0047151 | A1* | 3/2004 | Bogner et al. ................ | 362/236 |
| 2009/0057693 | A1 | 3/2009 | Takeuchi et al. | |
| 2009/0057704 | A1* | 3/2009 | Seo et al. ..................... | 257/98 |
| 2010/0289040 | A1* | 11/2010 | Seo et al. ..................... | 257/91 |
| 2011/0049549 | A1* | 3/2011 | Kim et al. .................... | 257/98 |
| 2011/0127489 | A1* | 6/2011 | Lee et al. ..................... | 257/13 |
| 2011/0175056 | A1 | 7/2011 | Cho et al. | |
| 2011/0220940 | A1* | 9/2011 | Kim ............................. | 257/98 |
| 2011/0227109 | A1* | 9/2011 | Kim et al. .................... | 257/98 |
| 2011/0227114 | A1* | 9/2011 | Kim et al. .................... | 257/98 |
| 2011/0241045 | A1* | 10/2011 | Ye et al. ....................... | 257/98 |
| 2011/0241050 | A1* | 10/2011 | Ye et al. ....................... | 257/98 |
| 2011/0291070 | A1* | 12/2011 | Won et al. .................... | 257/13 |
| 2011/0316026 | A1* | 12/2011 | Kim et al. .................... | 257/98 |
| 2012/0098019 | A1* | 4/2012 | Seo et al. ..................... | 257/98 |
| 2012/0135551 | A1* | 5/2012 | Seo et al. ..................... | 438/28 |
| 2012/0286309 | A1* | 11/2012 | Chae et al. ................... | 257/98 |
| 2013/0001615 | A1* | 1/2013 | Kim ............................. | 257/98 |
| 2013/0001616 | A1* | 1/2013 | Kim ............................. | 257/98 |

FOREIGN PATENT DOCUMENTS

| | | | | |
|---|---|---|---|---|
| CN | 102044613 A | 5/2011 | | |
| CN | 102136538 A | 7/2011 | | |
| JP | 2003-142730 A | 5/2003 | | |
| JP | 2006-135215 A | 5/2006 | | |
| KR | 2008-14647 | 2/2008 | | |
| KR | 10-2009-0072478 A | 2/2009 | | |
| KR | 2009-27329 | 3/2009 | | |
| KR | 10-2010-0036758 A | 4/2010 | | |
| WO | WO 2009084857 A2 * | 7/2009 | ............. | H01L 33/00 |
| WO | WO 2009/084857 * | 9/2009 | ............. | H01L 33/00 |

* cited by examiner

*Primary Examiner* — Laura Menz (74) *Attorney, Agent, or Firm* — McKenna Long & Aldridge LLP (57) ABSTRACT

Provided are a light emitting device, a light emitting device package, and a lighting system. The light emitting device may include a reflective metal support including at least two pairs of first and second reflective metal layers, a light emitting structure layer including a first conductive type semiconductor layer, a second conductive type semiconductor layer, and an active layer between the first conductive type semiconductor and the second conductive type semiconductor layer on the reflective metal support, and an electrode on the light emitting structure layer. The reflective metal support includes at least one of Al, Ag, an APC(Ag—Pd—Cu) alloy, and an Au—Ni alloy.

20 Claims, 5 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority of Korean Patent Application No. 10-2010-0020922 filed on Mar. 9, 2010, which is hereby incorporated by reference in its entirety as if fully set forth herein.

BACKGROUND OF THE INVENTION

Embodiments relate to a light emitting device, a light emitting device package, and a lighting system.

Light emitting diodes (LEDs) are semiconductor light emitting devices that convert current into light.

A wavelength of light emitted from such an LED depends on a semiconductor material used for manufacturing the LED. This is done because the wavelength of the emitted light depends on a band-gap of the semiconductor material, which refers to an energy difference between valence band electrons and conduction band electrodes.

As brightness of LEDs has gradually increased in recent years, the LEDs are being used as light sources for displays, vehicles, and illuminations. Also, LEDs emitting white light having superior efficiency may be realized by using a fluorescent substance or combining LEDs having various colors.

SUMMARY OF THE INVENTION

Exemplary embodiments provide a light emitting device having a new structure, a light emitting device package, and a lighting system.

Exemplary embodiments also provide a light emitting device having improved light efficiency, a light emitting device package, and a lighting system.

Exemplary embodiments also provide a light emitting device having heat radiation efficiency, a light emitting device package, and a lighting system.

In one exemplary embodiment, a light emitting device includes: a reflective metal support including at least two pairs of first and second reflective metal layers; a light emitting structure layer including a first conductive type semiconductor layer, a second conductive type semiconductor layer, and an active layer between the first conductive type semiconductor and the second conductive type semiconductor layer on the reflective metal support; and an electrode on the light emitting structure layer, wherein the reflective metal support includes at least one of Al, Ag, an APC(Ag—Pd—Cu) alloy, and an Au—Ni alloy.

In another exemplary embodiment, a light emitting device includes: a reflective metal support including a first reflective metal layer having a compressive stress and a second reflective metal layer having a tensile stress; a light emitting structure layer including a first conductive type semiconductor layer, a second conductive type semiconductor layer, and an active layer between the first conductive type semiconductor and the second conductive type semiconductor layer on the reflective metal support; and an electrode on the light emitting structure layer.

In further another exemplary embodiment, a light emitting device package includes: a package body; first and second electrodes on the package body; a light emitting device electrically connected to the first and second electrodes on the package body; and a molding member surrounding the light emitting device on the package body, wherein the light emitting device includes: a reflective metal support including at least two pairs of first and second reflective metal layers; a light emitting structure layer including a first conductive type semiconductor layer, a second conductive type semiconductor layer, and an active layer between the first conductive type semiconductor and the second conductive type semiconductor layer on the reflective metal support; and an electrode on the light emitting structure layer, wherein the reflective metal support includes at least one of Al, Ag, an APC(Ag—Pd—Cu) alloy, and an Au—Ni alloy.

The details of one or more embodiments are set forth in the accompanying drawings and the description below. Other features will be apparent from the description and drawings, and from the claims.

DESCRIPTION

In the descriptions of exemplary embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a light emitting device package, a lighting system, and a method of manufacturing the light emitting device according to exemplary embodiments will be described with reference to accompanying drawings.

Figure 1:
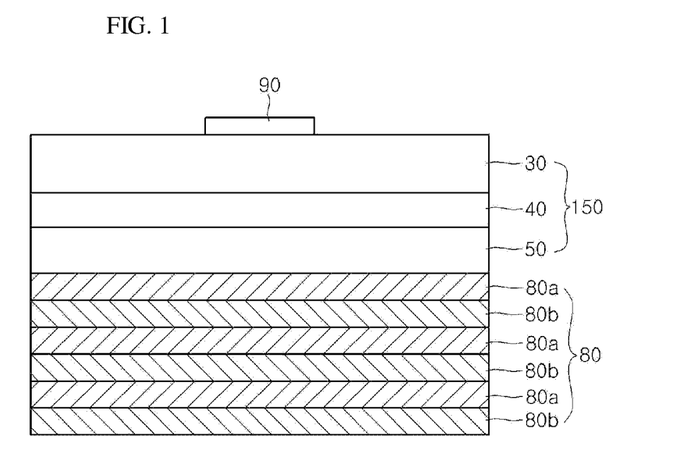
FIG. 1 is a view of a light emitting device according to a first exemplary embodiment.

FIG. 1 is a view of a light emitting device according to a first exemplary embodiment.

Referring to FIG. 1, a light emitting device according to a first embodiment may include a reflective metal support 80, a light emitting structure layer 150 on the reflective metal support 80, and an electrode 90 on the light emitting structure layer 150.

The reflective metal support 80 may include a first reflective metal layer 80a and a second reflective metal layer 80b. When the first reflective metal layer 80a and the second reflective metal layer 80b are defined as one pair of unit layers, the reflective metal support 80 may include a plurality of pairs of unit layers.

For example, the reflective metal support 80 may include 2 pairs to 80 pairs of the first and second reflective metal layers 80a and 80b. Particularly, the reflective metal support 80 may include 30 pairs to 70 pairs of the first and second reflective metal layers 80a and 80b, and furthermore, 40 pairs to 60 pairs of the first and second reflective metal layers 80a and 80b.

The first reflective metal layer 80a and the second reflective metal layer 80b may be formed of a same metal or different metals. For example, each of the first and second reflective metal layers 80a and 80b may have a thickness of about 0.1 μm to about 10 μm. Particularly, one of the first and second reflective metal layers 80a and 80b may have a thickness of about 0.4 μm to about 0.8 μm and the other one of the first and second reflective metal layers 80a and 80b may have a thickness of about 0.8 μm to about 1.2 μm.

The reflective metal support 80 may include the plurality of pairs of the first and second reflective metal layers 80a and 80b, which are stacked on each other, and a thickness of about 50 μm to about 200 μm. The reflective metal support 80 may have a thickness thicker than that of the light emitting structure layer 150. For example, the light emitting structure layer 150 may have a thickness of about 3 μm to about 4 μm.

The first reflective metal layer 80a may have a compressive stress, and the second reflective metal layer 80b may have a tensile stress. On the other hand, the first reflective metal layer 80a may have a tensile stress, and the second reflective metal layer 80b may have a compressive stress.

Since the first reflective metal layer 80a and the second reflective metal layer 80b may have stresses opposite to each other, the compressive stress of the first reflective metal layer 80a and the tensile stress of the second reflective metal layer 80b may be offset to each other to reduce a stress of the reflective metal support 80. Thus, since the stress of the reflective metal support 80 may have a little effect on the light emitting structure layer 150, the reflective metal support 80 may have a thick thickness.

For example, the first reflective metal layer 80a may have a compressive stress of about 100 MPa to about 2,000 MPa, and the second reflective metal layer 80b may have a tensile stress of about 100 MPa to about 2,000 MPa. The reflective metal support 80 in which the plurality of pairs of the first and second metal layers 80a and 80b, which are stacked on each other, may have a compressive stress or a tensile stress of about 0 MPa to about 2,000 MPa.

Each of the first and second reflective metal layers 80a and 80b may be formed of a metal that can be formed using a dry deposition process such as a sputtering process or an E-beam evaporation process. For example, each of the first and second reflective metal layers 80a and 80b may be formed of at least one of Al, Ag, and an APC(Ag—Pd—Cu) alloy, which have high reflectance.

Also, since the first and second reflective metal layers 80a and 80b contact a second conductive type semiconductor layer 50, each of the first and second reflective metal layers 80a and 80b may be formed of an Au—Ni alloy, which has a low contact resistance with respect to the second conductive type semiconductor layer 50.

The reflective metal support 80 may be disposed directly under the second conductive type semiconductor layer 50 to contact the second conductive type semiconductor layer 50.

The light emitting structure layer 150 may have a stacked structure including a first conductive type semiconductor layer 30, an active layer 40, and the second conductive type semiconductor layer 50. As power is applied to the first and second conductive type semiconductor layers 30 and 50, light is emitted from the active layer 40.

Also, a first conductive type InGaN/GaN superlattice structure or InGaN/InGaN superlattice structure may be disposed between the first conductive type semiconductor layer 30 and the active layer 40.

Also, a second conductive type AlGaN layer may be disposed between the second conductive type semiconductor layer 50 and the active layer 40.

For example, the first conductive type semiconductor layer 30 may include an n-type semiconductor layer. The first conductive type semiconductor layer 30 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. Here, the n-type semiconductor layer is doped with an n-type dopant such as Si, Ge, or Sn.

The active layer 40 may be a layer in which electrons (or holes) injected through the first conductive type semiconductor layer 30 and holes (or electrons) injected through the second conductive type semiconductor layer 50 may be recombined to emit light by a band gap difference of an energy band depending on a formation material of the active layer 40.

The active layer 40 may have one of a single quantum well structure, a multi quantum well (MQW) structure, a quantum dot structure, and a quantum wire structure, but is not limited thereto.

The active layer 40 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 40 has the MQW structure, the active layer 40 may include a plurality of well layers and a plurality of barrier layers, which are stacked on each other. For example, the active layer 40 may be formed at a cycle of an InGaN well layer/GaN barrier layer.

A doped clad layer (not shown) in which an n-type or p-type dopant is doped may be disposed above/under the active layer 40. The clad layer (not shown) may be realized by an AlGaN layer or an InAlGaN layer.

For example, the second conductive type semiconductor layer 50 may be realized by a p-type semiconductor layer. The second conductive type semiconductor layer 50 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlInN, AlN, and InN. Also, the p-type semiconductor layer may be doped with the p-type dopant such as Mg, Zn, Ca, Sr, or Ba.

The first conductive type semiconductor layer 30 may include the p-type semiconductor layer, and the second conductive type semiconductor layer 50 may include the n-type semiconductor layer. Also, a third conductive type semiconductor layer (not shown) including an n-type or p-type semiconductor layer may be disposed on the second conductive type semiconductor layer 50. Thus, the light emitting structure layer may have at least one of an np junction structure, a pn junction structure, an npn junction structure, and a pnp junction structure. Also, impurities may be uniformly or non-uniformly doped into the first and second conductive type semiconductor layers 30 and 50. Thus, the light emitting structure layer may have various structures, but is not limited thereto.

The electrode 90 may be disposed on the first conductive type semiconductor layer 30, and the reflective metal support 80 may be disposed under the second conductive type semiconductor layer 50 to respectively supply power to the active layer 40. The electrode 90 may be formed of at least one of Au, Al, and Pt to easily perform wire bonding.

The light emitting device may be a GaN-based light emitting diode, which emits blue light having a wavelength region of about 45 nm to about 480 nm, particularly, having a centroid wavelength in a wavelength region of about 465 nm and having a full width at half maximum of about 15 nm to about 40 nm.

In the light emitting device according to the first exemplary embodiment, since the reflective metal support 80 is formed using the dry deposition process, there is an advantage in that a wet planting process, which may occur environmental pollution, may be excluded.

Also, in the light emitting device according to the exemplary first embodiment, since a method in which a conductive support substrate is attached using a solder metal is not used, but the reflective metal support 80 is formed using the dry deposition process, it may prevent reliability of the light emitting device from degraded due to cracks of the solder metal or a low heat transfer characteristic.

Also, in the light emitting device according to the first embodiment, since the reflective metal support 80 may include the first reflective metal layer 80a and the second reflective metal layer 80b, the stress of the reflective metal support 80 may be reduced. Thus, as the stress of the reflective metal support 80 is reduced, the occurrence of the defects of the light emitting structure layer may be reduced.

Also, in the light emitting device according to the first embodiment, the reflective metal support 80 having the high reflectance under the light emitting structure layer 150 may serve as a reflective layer for reflecting light emitted from the light emitting structure layer 150 and a conductive support substrate for supporting the light emitting structure layer 150. Thus, there is an advantage in that the light emitting device may be simplified in structure.

Also, in the light emitting device according to the first embodiment, since the reflective metal support 80 having the high reflectance under the light emitting structure layer 150 has a thick thickness, light emitted from the light emitting structure layer 150 may be reflected by a package body to proceed in a downward direction of the light emitting structure layer 150. Then, the light may be re-reflected and emitted to the outside of the package body. Therefore, the light emitting efficiency of the light emitting device may be improved.

Figure 2:
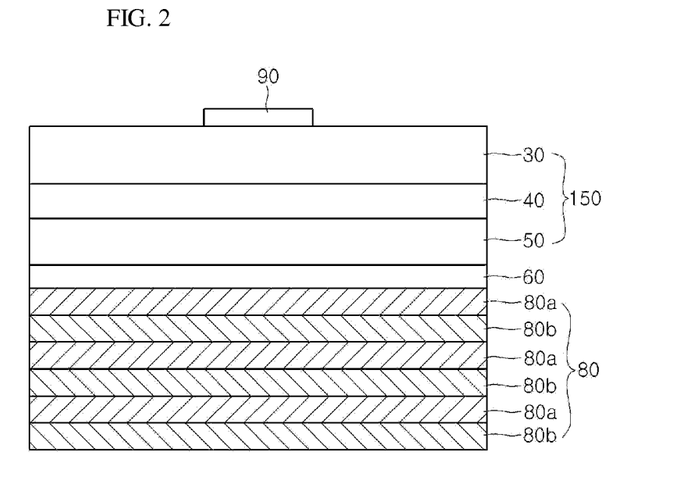
FIG. 2 is a view of a light emitting device according to a second exemplary embodiment.

FIG. 2 is a view of a light emitting device according to a second exemplary embodiment.

In descriptions of a light emitting device according to a second embodiment, descriptions duplicated with those of the light emitting device according to the first exemplary embodiment will be omitted.

Referring to FIG. 2, in the light emitting device according to the second embodiment, an ohmic contact layer 60 may be disposed between the light emitting structure layer 150 of the light emitting device according to the first embodiment and the reflective metal support 80.

The ohmic contact layer 60 may be formed of a transparent electrode layer. For example, the ohmic contact layer 60 may be formed of at least one of ITO, ZnO, $RuO_x$, $TiO_x$, and $IrO_x$, or at least one of Ni, Ag, and Au.

In a case where the ohmic contact layer 60 is provided, it is not necessary that the first and second reflective metal layers 80a and 80b should have an ohmic contact characteristic with the second conductive type semiconductor layer 50. Each of the first and second reflective metal layers 80a and 80b may be formed of at least one of Al, Ag, and APC(Ag—Pd—Cu), which have high reflectance.

The ohmic contact layer 60 may directly contact the second conductive type semiconductor layer of the light emitting structure layer 150 and the reflective metal support 80.

In the light emitting device according to the second embodiment, since the ohmic contact layer 60 is provided, there is a superior advantage in that the light emitting device has a superior ohmic contact characteristic with the second conductive type semiconductor layer 50.

Figures 3, 4:
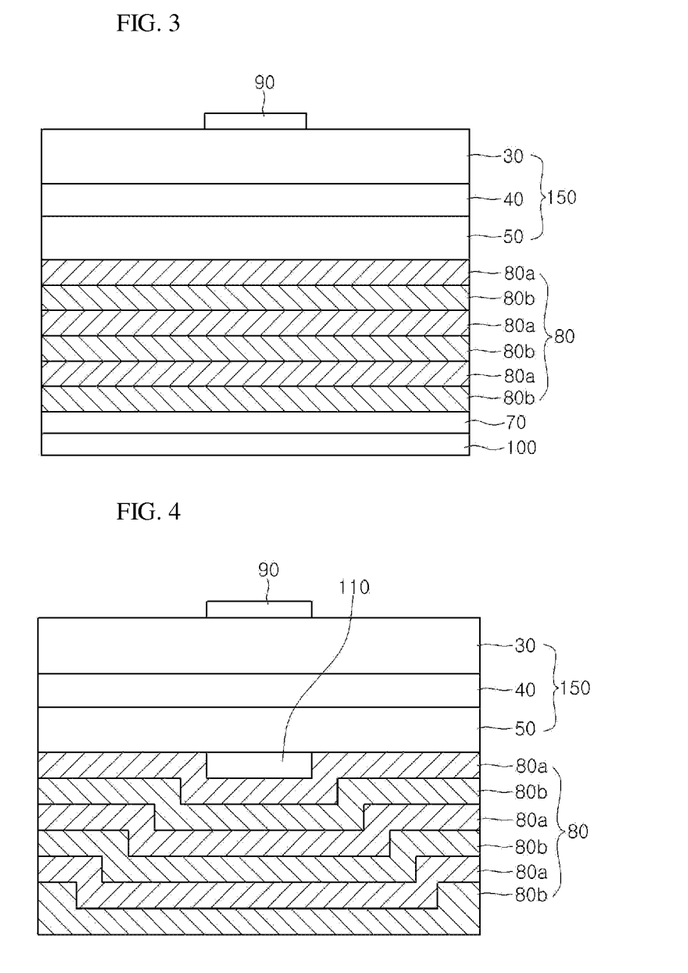
FIG. 3 is a view of a light emitting device according to a third exemplary embodiment.
FIG. 4 is a view of a light emitting device according to a fourth exemplary embodiment.

FIG. 3 is a view of a light emitting device according to a third exemplary embodiment.

In descriptions of a light emitting device according to a third embodiment, descriptions duplicated with those of the light emitting device according to the first exemplary embodiment will be omitted.

Referring to FIG. 3, in the light emitting device according to the third embodiment, a solder metal layer 70 and an oxide prevention layer 100 may be disposed under the reflective metal support 80 according to the first embodiment.

The light emitting device may be easily attached to a package body or a substrate by the solder metal layer 70. For example, the solder metal layer 70 may include one of Au—Sn solder, Ag—Sn solder, and Pb—Sn solder.

The oxide prevention layer 100 prevents the solder metal layer 70 and the reflective metal support 80 from being oxidized.

The solder metal layer 70 may be disposed directly blow the reflective metal support 70 to contact the reflective metal support 70. The oxide prevention layer 100 may be disposed directly under the solder metal layer 70 to contact the solder metal layer 70.

Although not shown, it is possible to use one of the solder metal layer 70 and the oxide prevention layer 100. In this case, the oxide prevention layer 100 may contact the reflective metal support 70.

Also, in the light emitting device according to the third embodiment, at least one of the solder metal layer 70 and the oxide prevention layer 100 may be applicable.

FIG. 4 is a view of a light emitting device according to a fourth exemplary embodiment.

In descriptions of a light emitting device according to a fourth embodiment, descriptions duplicated with those of the light emitting device according to the first exemplary embodiment will be omitted.

Referring to FIG. 4, in the light emitting device according to the fourth embodiment, a current block region 110 may be disposed under the light emitting structure layer 150 according to the first embodiment.

The current block region 110 may be formed of a dielectric material or a material having low conductivity. Also, the current block region 110 may be formed of a material having a schottky contact characteristic with the second conductive type semiconductor layer 50.

At least portion of the current block region 110 may vertically overlap the electrode 90. As the current block region 110 is provided, current flowing between the reflective metal support 80 and the electrode 90 may be spread into a wide region of the active layer 40. Thus, internal quantum efficiency of the light emitting device may be improved.

Each of the first and second reflective metal layers 80a and 80b under the current block region 110 may be spaced from the second conductive type semiconductor layer 50 corresponding to a position of the current block region 110. That is, central portions of each of first and second reflective metal layers 80a and 80b corresponding to the position of the current block region 110 may be lower than peripheral portions of each of first and second reflective metal layers 80a and 80b. Also, a portion of the first reflective metal layers 80a may be disposed on same horizontal portion with a portion of the second reflective metal layers 80b.

The reflective metal support 80 may be disposed directly under the current block region 110 to contact upper and side surfaces of the current block region 110.

Although not shown, the current block region 110 may be applied to the light emitting device according to the second embodiment or the light emitting device according to the third embodiment. Also, the current block region 110 may contact the second conductive type semiconductor layer 50.

Figure 5:
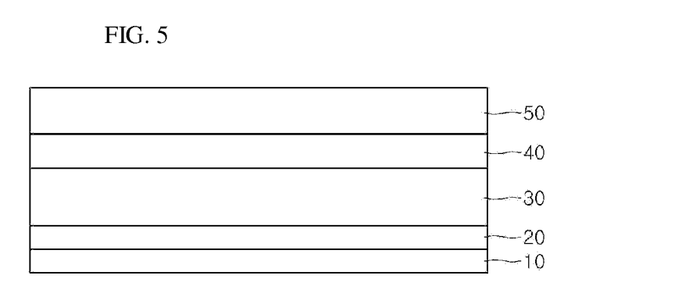
FIGS. 5 to 7 are views for explaining a process of manufacturing the light emitting device according to the first exemplary embodiment.
Figure 6:
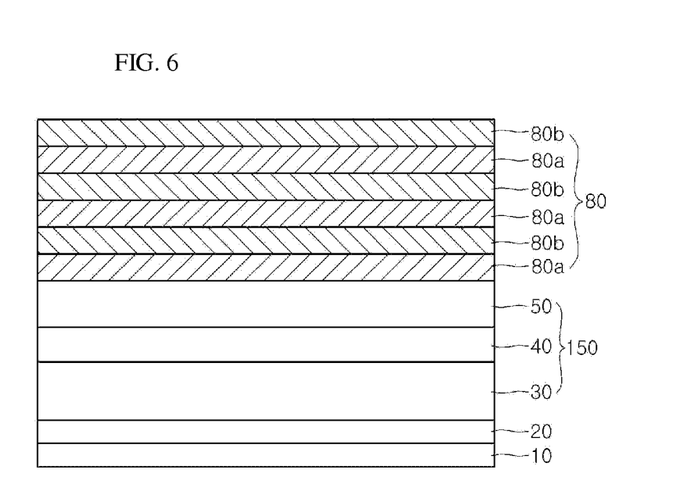
Figure 7:
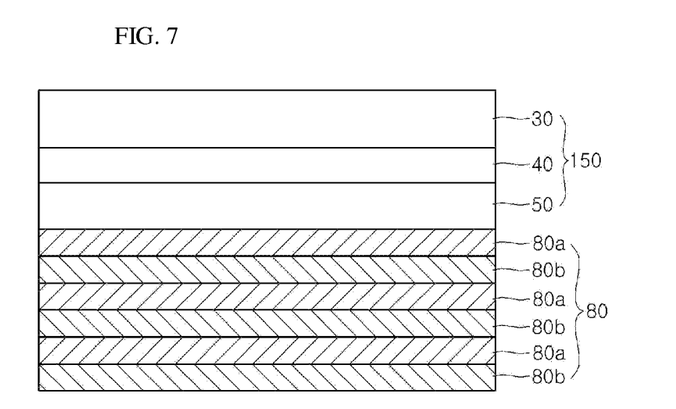

FIGS. 5 to 7 are views for explaining a process of manufacturing the light emitting device according to the first exemplary embodiment.

Referring to FIG. 5, an un-doped nitride layer 20 including a buffer layer may be formed on a growth substrate 10. A light emitting structure layer 150 including a first conductive type semiconductor layer 30, an active layer 40, and a second conductive type semiconductor layer 50 may be formed on the un-doped nitride layer 20.

For example, the growth substrate 10 may be formed of at least one of sapphire ($Al_2O_3$), Si, SiC, GaAs, ZnO, and MgO, but is not limited thereto. For example, the light emitting structure layer 150 may be grown on the growth substrate 10, and a sapphire substrate may be used as the growth substrate 10.

A plurality of protrusion patterns may be formed on the growth substrate 10. The protrusion patterns may disperse light emitted from the active layer 40 to improve light efficiency. For example, each of the protrusion patterns may have one of a hemisphere shape, a polygonal shape, a pyramid shape, and a nano pillar shape.

Even though a first conductive type is not intentionally injected into the un-doped nitride layer 20, the un-doped nitride layer 20 may be a nitride layer having a first conductive type conductivity. For example, the un-doped nitride layer 20 may include an undoped-GaN layer. The buffer layer may be formed between the un-doped nitride layer 20 and the growth substrate 10. Also, the formation of the un-doped nitride layer 20 is not necessary, and the un-doped nitride layer 20 may not be formed.

The un-doped nitride layer 20 may include a GaN-based semiconductor layer. For example, an un-doped GaN layer grown by injecting trimethylgallium (TMGa) gas, hydrogen gas, and ammonia gas into a chamber may be used as the un-doped nitride layer.

Trimethylgallium (TMGa) gas, silane gas ($SiH_4$) containing and N-type impurities (e.g., Si), hydrogen gas, and ammonia gas may be injected into the chamber to grow the first conductive type semiconductor layer 30. Then, the active layer 40 and the second conductive type semiconductor layer 50 may be formed on the first conductive type semiconductor layer 30.

The active layer 40 may have a single quantum well structure or a multi quantum well (MQW) structure. For example, the active layer 40 may have a stacked structure of an InGaN well layer/GaN barrier layer.

Trimethylgallium (TMGa) gas, Bis(ethylcyclopentadienyl) magnesium ($EtCp_2Mg$){$MgC_2H_5C_5H_4)_2$} gas containing the and P-type impurities (e.g., Mg), hydrogen gas, and ammonia gas may be injected into the chamber to grow the second conductive type semiconductor layer 50.

Referring to FIG. 6, a reflective metal support 80 may be formed on the second conductive type semiconductor layer 50. First, a first reflective metal layer 80a may be formed on the second conductive type semiconductor layer 50, and a second reflective metal layer 80b may be formed on the first reflective metal layer 80a. Then, a first reflective metal layer 80a may be formed again on the second reflective metal layer 80b, and a second reflective metal layer 80b may be formed again on the first reflective metal layer 80a. Here, the above-described processes may be repeatedly performed.

The first and second reflective metal layers 80a and 80b may be formed using a dry deposition process. The dry deposition process may include a sputtering process or an E-beam evaporation process. In case of the sputtering process, a high rate sputtering process may be used. The high rate sputtering process represents a sputtering process in which a magnetic material is disposed on a backside of a cathode sputtering target to vertically form a magnetic field in an electric field, and then, movement of electrons is restricted around the target to induce a rotation-reciprocation motion and increase a moving path, thereby increasing plasma density and improving sputtering yield.

The first and second reflective metal layers 80a and 80b may be formed of a same metal or different metals.

When the first and second reflective metal layers 80a and 80b are formed of a same metal, conditions of the sputtering process may be varied to allow the first and second reflective metal layers 80a and 80b to respectively have a tensile stress and a compressive stress.

For example, according to a process of forming a structure having the tensile stress and a structure having the compressive stress when a same metal is sputtered, if energy of the sputtered or evaporated metal is increased, since the metal reaching a substrate may have sufficient energy that can be diffused up to a desired position, the reflective metal layer having the compressive stress may be formed. A process of forming the reflective metal layer having the compressive stress may include a process of increasing a sputtering power, a method of reducing a pressure of sputtering gas, a method of increasing a temperature of the substrate, and a pulse sputtering process. For example, in a case where a pulse source and a DC source are prepared as a power source, when the pulse source is applied, the reflective metal layer having the compressive stress may be formed. Also, when the DC source is applied, the reflective metal layer having the tensile stress may be formed. Similarly, the sputtering power, the gas pressure, and the substrate temperature may be controlled to selectively form the reflective metal layer having the tensile stress and the reflective metal layer having the compressive stress.

Also, when the first and second metal layers 80a and 80b are formed using different materials, a metal that easily generates the tensile stress or the compressive stress may be used. Also, the first and second metal layers 80a and 80b may be formed using the process of generating the tensile stress and the compressive stress in the same metal as described above.

Referring to FIG. 7, the growth substrate 10 and the un-doped nitride layer 20 may be removed. The growth substrate 10 and the un-doped nitride layer 20 may be may be removed using a laser lift off process of a chemical lift off process.

An electrode 90 may be formed on the first conductive type semiconductor layer 30 exposed by removing the growth substrate 10 and the un-doped nitride layer 20. Thus, the light emitting device according to the first exemplary embodiment as shown in FIG. 1 may be manufactured.

Although not shown, after the second conductive type semiconductor layer 50 is formed in FIG. 5, when an ohmic contact layer 60 is further formed before the reflective metal support 80 is formed, the light emitting device according to the second embodiment may be manufactured.

Although not shown, when a solder metal layer 70 and an oxide prevention layer 100 are further formed after the reflective metal support 80 is formed in FIG. 6, the light emitting device according to the third exemplary embodiment may be manufactured.

Although not shown, after the second conductive type semiconductor layer 50 is formed in FIG. 5, when a current block region 110 is further formed before the reflective metal support 80 is formed, the light emitting device according to the fourth exemplary embodiment will be described.

Figure 8:
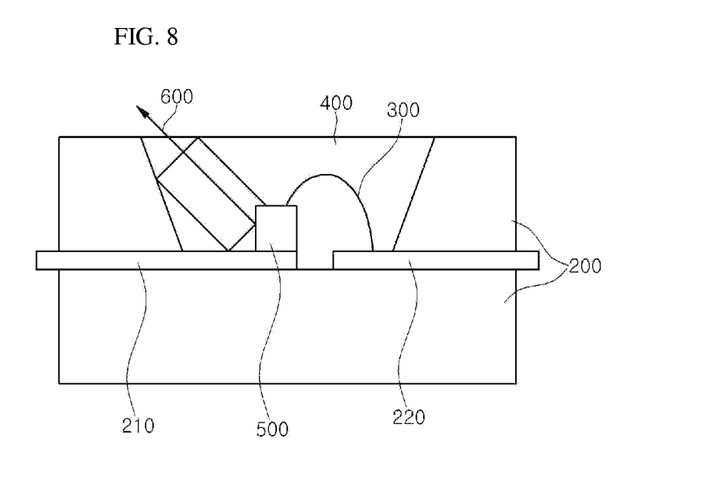
FIG. 8 is a view of a light emitting device package according to an exemplary embodiment.

FIG. 8 is a view of a light emitting device package according to an embodiment.

Referring to FIG. 8, a light emitting device package according to an embodiment may include a package body 200, first and second electrodes 210 and 220 disposed on the package body 200, a light emitting device 500 disposed on the package body 200 and electrically connected to the first and second electrodes 210 and 220, and a molding member 400 surrounding the light emitting device 500.

The package body 200 may be formed of a silicon material, a synthetic resin material, or a metal material. Also, an inclined surface may be disposed around the light emitting device 500.

The first and second electrodes 210 and 220 are electrically separated from each other to supply power to the light emitting device 500. Also, the first and second electrodes 210 and 220 may reflect light generated in the light emitting device 500 to increase light efficiency. In addition, the first and second electrodes 210 and 220 may discharge heat generated in the light emitting device 500 to the outside.

The light emitting device 500 may be applied to the light emitting device described in FIGS. 1 to 4. The light emitting device 500 may be disposed on the package body 200 or the first and second electrodes 210 and 220.

The reflective metal support 80 may be disposed on the most weaker portion of the light emitting device 500, and only a bonding material may be disposed between the reflective metal support 80 and the package body 220 or the first and second electrodes 210 and 220.

The light emitting device 500 may be electrically connected to the second electrode 220 through a wire 300.

The molding member 400 may surround the light emitting device 500 to protect the light emitting device 500. Also, a phosphor may be contained in the molding member 400 to change a wavelength of the light emitted from the light emitting device 500.

A portion 600 of light emitted from the light emitting device 500 may be fully reflected by a boundary between the molding member 400 and air. Thus, the fully reflected light may not be emitted to the outside. Then, the light reflected by the package body and incident into the light emitting device 500 may be reflected by the reflective metal support 80 of the light emitting device 500 and emitted to the outside.

In the light emitting device package according to an embodiment, since the light emitting device 500 includes the reflective metal support 80 having superior reflectance under the light emitting structure layer 150, the light emitting device 500 may have high light emitting efficiency when compared that a conductive support substrate having low reflectance instead of the reflective metal support 80 is used.

Also, the light emitting device package may include a chip on board (COB) type light emitting device package. The package body 200 may have a flat top surface, and a plurality of light emitting devices 500 may be disposed on the package body 200.

Also, the light emitting device according to an embodiment may be provided in plurality. The plurality of light emitting devices may be arrayed on the substrate. Optical members such as a light guide plate, a prism sheet, a diffusion sheet, and a fluorescence sheet may be disposed on a path of the light emitted from the light emitting device packages. The light emitting device package, the substrate, and the optical members may function as a backlight unit. According to another embodiment, the light emitting device 500 or the light emitting device package according to the above-described embodiments may be realized as a lighting unit. For example, the lighting unit may include a display device, an indicating device, a lamp, and a street lamp.

Figure 9:
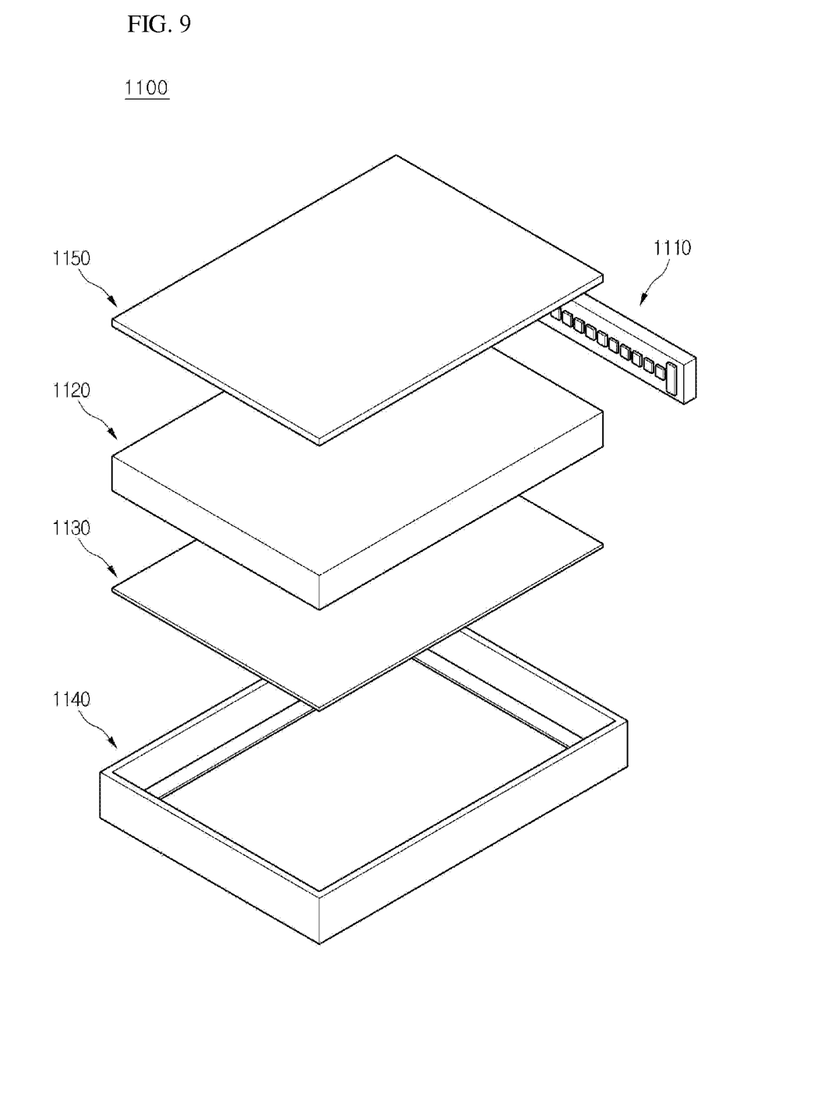
FIG. 9 is a view of a backlight unit using a light emitting device or a light emitting device package according to an exemplary embodiment.

FIG. 9 is a view of a backlight unit using a light emitting device or a light emitting device package according to an exemplary embodiment. However, the backlight unit 1100 of the FIG. 9 is an example of a lighting system, and the present disclosure is not limited thereto.

Referring to FIG. 9, the backlight unit 1100 may include a bottom cover 1140, a light guide member 1120 disposed within the bottom cover 1140, and a light emitting module 1110 disposed on at least one side or an under surface of the light guide member 1120. Also, a reflective sheet 1130 may be disposed under the light guide member 1120.

The bottom cover 1140 may have a box shape with an opened upper side to receive the light guide member 1120, the light emitting module 1110, and the reflective sheet 1130. The bottom cover 1140 may be formed of a metal material or a resin material, but is not limited thereto.

The light emitting module 1110 may include a substrate and a plurality of light emitting device or light emitting device packages, which are mounted on the substrate. The plurality of light emitting device or light emitting device packages may provide light to the light guide member 1120.

As shown in FIG. 15, the light emitting module 1110 may be disposed on at least one of inner surfaces of the bottom cover 1140. Thus, the light emitting module 1110 may provide light toward at least one lateral surface of the light guide member 1120.

The light emitting module 1110 may be disposed on an under surface the light guide member 1120 to provide light toward the under surface of the light guide member 1120. This may be variously varied according to a design of the backlight unit 1100, and thus, the present disclosure is not limited thereto.

The light guide member 1120 may be disposed within the bottom cover 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. The fluorescence sheet may be a light transmitting plate or film including a phosphor.

The reflective sheet 1130 may be disposed under the light guide member 1120. The reflective sheet 1130 reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 10:
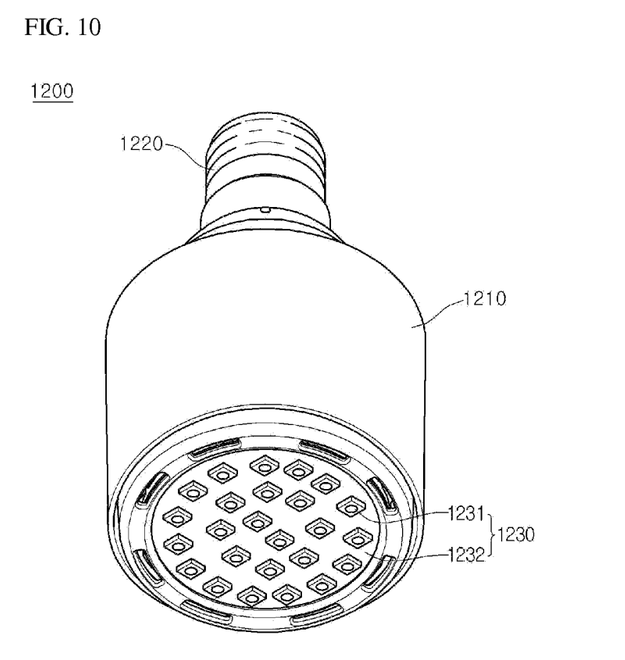
FIG. 10 is a view of a lighting unit using a light emitting device or a light emitting device package according to an exemplary embodiment.

FIG. 10 is a view of a lighting unit using a light emitting device or a light emitting device package according to an embodiment. However, the lighting unit 1200 of FIG. 10 is an example of a lighting system, and thus, the present disclosure is not limited thereto.

Referring to FIG. 10, the lighting system 1200 may include a case body 1210, a light emitting module 1230 disposed on the case body 1210, a connection terminal 1220 disposed on the case body 1210 to receive power from an external power source.

The case body 1210 may be formed of a material having good thermal dissipation properties, e.g., a metal material or a resin material.

The light emitting module 1230 may include a substrate 1232 and at least one light emitting device package 1231 mounted on the substrate 1232.

A circuit pattern may be printed on a dielectric to form the substrate 1232. For example, the substrate 1232 may include a printed circuit board (PCB), a metal core PCB, a flexible PCB, and a ceramic PCB.

Also, the substrate 1232 may be formed of an effectively reflective material or have a color on which light is effectively reflected from a surface thereof, e.g., a white color or a silver color.

At least one light emitting device package 1231 may be mounted on the substrate 1232. The light emitting device package 1231 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 10, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a stressed reflective metal support comprising at least two pairs of first and second reflective metal layers;
a light emitting structure layer comprising a first conductive type semiconductor layer, a second conductive type semiconductor layer, and an active layer between the first conductive type semiconductor and the second conductive type semiconductor layer on the stressed reflective metal support;
a current block region between the stressed reflective metal support and the light emitting structure layer;
an electrode on the light emitting structure layer,
wherein at least one portion of the current blocking region is overlapped with the electrode with respect to the light emitting structure layer,
wherein the stressed reflective metal support includes at least one of Al, Ag, an APC(Ag—Pd—Cu) alloy, and an Au—Ni alloy, and
wherein an upper surface of the stressed reflective metal support is contacted with the current block region and the bottom surface of the light emitting structure layer.

2. The light emitting device of claim 1, wherein each of the first and second reflective metal layers has a portion corresponding to the position of the current block region lower than a peripheral portion of each of first and second reflective metal layers.

3. The light emitting device of claim 1, wherein the stressed reflective metal support has a thickness thicker than that of the light emitting structure layer.

4. The light emitting device of claim 3, wherein each of the first and second reflective metal layers has a thickness of about 0.1 µm to about 10 µm and the stressed reflective metal support has a thickness of about 50 µm to about 200 µm.

5. The light emitting device of claim 1, wherein the first and second reflective metal layers are formed of a same material.

6. The light emitting device of claim 1, wherein the first and second reflective metal layers are formed of different materials.

7. The light emitting device of claim 1, wherein the stressed reflective metal support includes 2 pairs to 80 pairs of the first and the second reflective metal layers.

8. The light emitting device of claim 1, wherein one of the first and the second reflective metal layers has a thickness of about 0.4 μm to about 0.8 μm, and the other one of the first and the second reflective metal layers has a thickness of about 0.8 μm to about 1.2 μm.

9. The light emitting device of claim 1, wherein the light emitting structure layer has a thickness of about 3 μm to about 4 μm.

10. The light emitting device of claim 1, wherein the first conductive type semiconductor layer is formed of a semiconductor material having a compositional formula of $In_xAl_yGa_{1-x-y}N$ ($0 \leq x \leq 1$, $0 \leq y \leq 1$, $0 \leq x+y \leq 1$).

11. The light emitting device of claim 1, wherein the second conductive type semiconductor layer is formed of a semiconductor material having a compositional formula of $In_xAl_yGa_{1-x-y}N$ ($0 \leq x \leq 1$, $0 \leq y \leq 1$, $0 \leq x+y \leq 1$).

12. The light emitting device of claim 1, wherein the electrode is formed of at least one of Au, Al, and Pt.

13. The light emitting device of claim 1, wherein the light emitting device is a GaN-based light emitting diode, which emits blue light having a wavelength region of about 450 nm to about 480 nm.

14. A light emitting device comprising:
a stressed reflective metal support comprising at least two pairs of first and second reflective metal layers;
a light emitting structure layer comprising a first conductive type semiconductor layer, a second conductive type semiconductor layer, and an active layer between the first conductive type semiconductor and the second conductive type semiconductor layer on the stressed reflective metal support;
a current block member between the stressed reflective metal support and an bottom surface of the second conductive type semiconductor layer;
an electrode on an upper surface of the first conductive type semiconductor layer,
wherein at least one portion of the current blocking region is overlapped with the electrode with respect to the light emitting structure layer, and
wherein an upper surface of the stressed reflective metal support is contacted with the current block member and the bottom surface of the second conductive type semiconductor layer.

15. The light emitting device of claim 14, wherein the stressed reflective metal support includes at least one of Al, Ag, an APC(Ag—Pd—Cu) alloy, and an Au—Ni alloy.

16. The light emitting device of claim 14, wherein each of the first and second reflective metal layers has a portion corresponding to the position of the current block region lower than a peripheral portion of each of first and second reflective metal layers.

17. The light emitting device of claim 14, wherein the stressed reflective metal support has a thickness thicker than that of the light emitting structure layer.

18. The light emitting device of claim 14, wherein each of the first and second reflective metal layers has a thickness of about 0.1 μm to about 10 μm and the stressed reflective metal support has a thickness of about 50 μm to about 200 μm.

19. The light emitting device of claim 14, wherein the current block member has a schottky contact characteristic with the second conductive type semiconductor layer.

20. The light emitting device of claim 1, wherein the current block region has a schottky contact characteristic with the second conductive type semiconductor layer.

\* \* \* \* \*